(12) United States Patent
Hollander

(10) Patent No.: US 10,444,309 B2
(45) Date of Patent: Oct. 15, 2019

(54) DIGITAL AMPLIFIER

(71) Applicant: KONINKLIJKE PHILIPS N.V., Eindhoven (NL)

(72) Inventor: Martin Hollander, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 370 days.

(21) Appl. No.: 15/393,496

(22) Filed: Dec. 29, 2016

(65) Prior Publication Data

US 2017/0108565 A1   Apr. 20, 2017

Related U.S. Application Data

(63) Continuation of application No. 13/002,809, filed as application No. PCT/IB2009/052897 on Jul. 3, 2009, now Pat. No. 9,541,609.

(30) Foreign Application Priority Data

Jul. 11, 2008 (EP) .................................... 08160182

(51) Int. Cl.
*G01R 33/385* (2006.01)
*H03F 1/02* (2006.01)
(Continued)

(52) U.S. Cl.
CPC ....... *G01R 33/3852* (2013.01); *G01R 33/022* (2013.01); *H03F 1/02* (2013.01);
(Continued)

(58) Field of Classification Search
CPC ..... G01R 33/022; G01R 33/3852; H03F 1/02; H03F 1/34; H03F 2200/117; H03F 2200/465
See application file for complete search history.

(56) References Cited

U.S. PATENT DOCUMENTS 5,266,952 A  11/1993  Stone et al.
6,036,972 A   3/2000  Nakamura et al.
(Continued)

FOREIGN PATENT DOCUMENTS

WO     018893 A1    5/2001

OTHER PUBLICATIONS

Anderson et al "Second Generation Intelligent Class D Amplifier Controller Integrated Circuit . . . " Audio Engineering Society Convention Paper 6692, 2006, 1-28.

*Primary Examiner* — Rishi R Patel

(57) ABSTRACT

The invention relates to a digital amplifier for providing a desired electrical output power, the amplifier comprising a power source (100) for generating the electrical output power, the amplifier further comprising:
  a digital input adapted for receiving a digital input signal (112), the digital input signal (112) representing the desired electrical output power level,
  a reference power generator (124) for generating an analogue reference power controlled by the digital input signal (112),
  a power measurement component (142; 128) adapted for measuring the power differential between the electrical output power provided by the power source (100) and the analogue reference power,
  an analogue-to-digital converter (130) adapted for converting the power differential into a digital power differential value (132),
  a combiner adapted for providing a combined digital signal (136) by adding the digital power differential value (132) to the digital value input to the reference power generator (124) for generating the analogue reference power, wherein the power source (100) is adapted for providing the electrical power corrected for (Continued)

the difference between the power indicated by the digital input signal (112) and the combined digital signal (136).

20 Claims, 4 Drawing Sheets

(51) Int. Cl.
*H03F 1/34* (2006.01)
*G01R 33/022* (2006.01)

(52) U.S. Cl.
CPC .......... *H03F 1/34* (2013.01); *H03F 2200/117* (2013.01); *H03F 2200/465* (2013.01)

(56) References Cited

U.S. PATENT DOCUMENTS

| | | |
|---|---|---|
| 6,285,304 B1 | 9/2001 | Schweighofer |
| 6,369,572 B1 | 4/2002 | Van Groningen et al. |
| 9,541,609 B2 * | 1/2017 | Hollander ............ G01R 33/022 |
| 2006/0091945 A1 | 5/2006 | Wegner |
| 2006/0214827 A1 * | 9/2006 | Sherry ................ H03F 1/34 |
| | | 341/120 |
| 2007/0241812 A1 | 10/2007 | Yang |
| 2009/0267688 A1 | 10/2009 | Hoyerby |

* cited by examiner

DIGITAL AMPLIFIER

CROSS-REFERENCE TO PRIOR APPLICATIONS

This application is a continuation of U.S. patent application Ser. No. 13/002,809, filed Jan. 6, 2011, which is the U.S. National Phase application under 35 U.S.C. § 371 of International Application No. PCT/IB2009/052897, filed on Jul. 3, 2009, which claims the benefit of European Patent Application No. 08160182.5, filed on Jul. 11, 2008. These applications are hereby incorporated by reference herein.

TECHNICAL FIELD

The invention relates to a digital amplifier, a method of providing a desired electrical output power by a digital amplifier and a computer program product.

BACKGROUND AND RELATED ART

Magnetic resonance imaging (MRI) is a state of the art imaging technology which allows cross sectional viewing of objects like the human body with unprecedented tissue contrast. MRI is based on the principles of nuclear magnetic resonance (NMR), a spectroscopic technique used by scientists to obtain microscopic chemical and physical information about molecules. The basis of both NMR and MRI is the fact, that atomic nuclei with none zero spin have a magnetic moment. In medical imaging, usually nuclear hydrogen atoms are studied since they are present in the body in high concentrations for example water. The nuclear spin of elementary particles can resonate at a resonance frequency, if a strong DC magnetic field ($B_0$ field) is applied. The magnetic resonance (MR) frequency is determined by the level of the magnetic flux. In an MRI scanner, the magnetic field matches a selected resonance frequency only at one position in space. By varying this position step by step, an image can be measured.

The needed strong DC magnetic field is typically generated by superconducting magnets. In order to vary these fields, such that it matches a given radio frequency only at one position, a field gradient is generated using gradient coils. Thereby, the field gradient can vary over time to achieve a scan. The frequency range in the gradient coils is low and reaches up to a maximum of 10 kHz.

Typically, in MRI apparatus the gradient coils are connected to respective gradient amplifiers. The gradient coils are driven by electrical currents of several hundreds of Amperes, which need to be accurately controlled in the range of mA in order to assure an acquisition of MRI images at high quality and precision.

This requires an accurate control of the gradient amplifier output which can be for example performed by control circuits using feedback loops.

For example U.S. Pat. No. 6,285,304 B1 discloses an analogue-to-digital converter circuit and control device for a gradient amplifier of a magnetic resonance imaging system.

The major disadvantage with such kind of control devices for gradient amplifiers is that these control devices require high precision electronics, like high precision digital-to-analogue converters. Thus, the requirements of high precision, resolution and stability makes it impossible to use commercial analogue-to-digital converters or digital-to-analogue converters to provide a full digital controlled gradient amplifier for MRI applications.

SUMMARY OF THE INVENTION

The present invention provides a digital amplifier for providing a desired electrical output power, the amplifier comprising a power source for generating the electrical output power, the amplifier further comprising a digital input adapted for receiving a digital input signal, the digital input signal representing the desired electrical output power level, and a reference power generator for generating an analogue reference power controlled by a digital input signal. The amplifier further comprises a power measurement component adapted for measuring the power differential between the electrical output power provided by the power source and the analogue reference power. Further, an analogue-to-digital converter is provided which is adapted for converting the power differential into a digital power differential value. Further, the amplifier comprises a combiner adapted for providing a combined digital signal by adding a digital power differential value to the digital value input to the reference power generator for generating the analogue reference power, wherein the power source is adapted for providing the electrical power corrected for the power difference indicated by the digital input signal and the combined digital signal.

Embodiments according to the invention have the advantage, that in order to guarantee a high precision control of the amplifier output, electronic components with larger tolerances regarding their precision can be used instead of expensive high-precision electrical components. Existing amplifier designs typically require high precision analogue-to-digital converters or high precision digital-to-analogue converters. A number of digital filter techniques exist to increase the resolution of these converters, which however comes at the cost of the introduction of considerable dead time of such amplifiers.

The analogue-to-digital converter of the digital amplifier according to the invention does only need to convert the difference between the output signal and the analogue reference power. In other words, the analogue reference power reduces the dynamic range of the output signal to a lower dynamic range for the feedback signal, such that the analogue-to-digital converter used for converting the power differential into a digital power differential value does not have to be a high precision analogue-to-digital converter: due to the reduced dynamic range of the power differential the precision requirements for this analogue-to-digital converter can be eased.

In accordance with an embodiment of the invention, the amplifier further comprises a feedforward controller adapted for digitally controlling the reference power generator by emulating the output power generation characteristics of the power source. In other words, the feedforward controller is preferably receiving the digital input signal representing the desired electrical output level and provides the reference power generator with a modified digital feedforward signal which represents the amplification behavior of the power source. Preferably, the feedforward controller is able to emulate at high precision the dynamic amplification behavior of the power source. The usage of a feedforward controller which is able to precisely emulate the power source has the advantage, that the dynamic range of the power differential provided to the analogue-to-digital converter is further reduced, which further eases the restrictions regarding the precision of this analogue-to-digital converter in order to provide a precise digitized power differential value.

Nevertheless, the invention can also be carried out without precisely emulating the amplification behavior of the power converter.

In accordance with an embodiment of the invention, the feedforward controller is adapted for emulating the output power generation characteristics of the power source corrected for time delay differences between the digital input signal and the digital power differential signal. In another embodiment, the difference between the digital input signal and the combined digital signal is provided from the power source to the feedforward controller. This allows the feedforward controller to self-correct for example for constant errors like offsets in the power source amplification behavior.

A further possibility to provide a high precision emulation of the output power generation characteristics of the power source is that the feedforward controller is further adapted for performing the emulation of the output power generation characteristics of the power source depending on operational parameters of the power source, wherein the operational parameters being selected from the group of power source component temperature and power source component age. In other words, the feedforward controller comprises an input on which it receives these operational parameters of the power source. Aging of power source components or temperature changes of individual power source electronic components may change the output power generation characteristics of the power source in a predictable manner, such that even over a longer period of time the feedforward controller is able to precisely emulate the power source output power generation characteristics.

In accordance with a further embodiment of the invention, the reference power generator comprises a set of switches digitally controlled by digital input signal, wherein each switch is controlling the electrical output of an amplifier, wherein the reference power generator is adapted for setting the level of the analogue reference power by combining the electrical output of the switched amplifiers. Preferably, the set of switches are digitally controlled by the digital output signal of a feedforward controller.

The usage of such switches controlling an amplifier, wherein the level of analogue reference power is set by combining the electrical output of these switched amplifiers is, that a precise reference voltage can be amplified by simple amplifiers, wherein depending on the state of the switches the amplified signals can be connected to an analogue summator, like for example a precision operational amplifier. In other words, instead of using a rather expensive and complicated high power reference power generator which is able to simulate an output current which may have amplitudes up to 1,000 amperes, simple low power amplifiers can be used which nevertheless provide for high precision and high resolution reference power generation. It has to be noted here, that even though it is desired to reduce the dynamic range of the power differential signal as much as possible, even in case the analogue reference power is not precisely emulating the electrical output power provided by the power source, the precision requirements regarding the analogue-to-digital converter are only that the analogue-to-digital converter is able to precisely digitize variations in the power differential which is at most in the range of a few hundred mA with a precision of a few mA which is possible with many state of the art analogue-to-digital converters commercially available today.

In accordance with a further embodiment of the invention, the power measurement component comprises an output magnetic field generating component adapted for inductively generating a magnetic field from the electric output power. The power measurement component further comprises a reference magnetic field generating component adapted for inductively generating a magnetic field from the analogue reference power, wherein the generated reference magnetic field is directed in opposite direction to the output magnetic field. Further, the power measurement component comprises a magnetic field detection component adapted for determining the power differential between the electrical output power and the analogue reference power by measuring a superposition of the output magnetic field and the reference magnetic field.

The usage of such kind of power measurement components has the advantage, that the power differential between the electrical output power provided by the power source and the analogue reference power can be measured without the need of using additional subtractors subtracting the analogue reference power from the electrical output power typically detected by means of a current sensor. In other words, the subtraction of the output signal and the analogue reference power signal is directly performed in the power measurement component by means of the superposition of the magnetic fields generated by the electrical output power and the analogue reference power. The current sensor or magnetic field detection component measures the resulting total magnetic field produced by the electrical output current and reference power currents running through such kind of sensor.

The output magnetic field generating component and the reference magnetic field generating component may for example just be a single wire fed with the electrical output power and the analogue reference power, respectively, wherein these wires are arranged in parallel and wherein the electrical output power current is running in opposite direction to the electrical current of the analogue reference power. Alternatively, the output magnetic field generating component and/or the reference magnetic field generating component may comprise coils fed in opposite directions by the electrical output current and/or the electrical reference current.

The magnetic field detection component may also be a pick up coil, or a Hall sensor or even a SQUID, which however requires extensive cooling. Nevertheless, since MRI systems typically comprise high power cryogenic cooling systems, such a cooling is feasible.

It has to be noted here, that the invention is not only restricted to MRI systems but can also be applied to any kind of digital amplifiers which require a high precision feedback control of the output power. This includes amplifier for usage in high precision servo applications like for example used in manufacturing facilities for wafer steppers, or other kind of high precision material manufacturing techniques.

In accordance with an embodiment of the invention, the reference magnetic field creating component comprises multiple coil winding sets, wherein each coil winding set comprises at least one coil winding, wherein the reference power generator is adapted for generating the reference magnetic field level by selecting a number of the coil winding sets for feeding a reference current through the coil winding sets, wherein the number of selected coil winding sets is determined from the analogue reference power level. In other words, the reference current is generated preferably by a single reference current source. By simply selecting the number of selected coil winding sets, the reference magnetic field can be generated and controlled by increasing or decreasing the number of selected coil windings. A high power reference current source is thus not required while it is nevertheless possible to emulate the power source electrical output power generation characteristics.

In another aspect, the invention relates to a method of providing a desired electrical output power by a digital amplifier, the amplifier comprising a power source for generating the electrical output power, wherein the method comprises receiving a digital input signal by the amplifier, the digital input signal representing the desired electrical output power level. The method further comprises generating by a reference power generator an analogue reference power, wherein the reference power generation is controlled by a digital input signal. The power differential is measured between the electrical output power provided by the power source and the analogue reference power by a power measurement component. Then, the power differential is converted into a digital power differential value by an analogue-to-digital converter. By a combiner, a combined digital signal is provided by adding the digital power differential value to the digital value input to the reference power generator for generating the analogue reference power, wherein the power source is providing the analogue reference power corrected for the difference between the power indicated by the digital input signal and the combined digital signal.

In accordance with an embodiment of the invention, the method further comprises digitally controlling by a feedforward controller the reference power generator by emulating the output power generation characteristics of the power source.

In accordance with an embodiment of the invention, the digital controlling of the reference power generator further comprises emulating the output power generation characteristics of the power source corrected for time delay differences between a digital input signal and a digital power differential value signal.

In accordance with an embodiment of the invention, the emulation of the output power generation characteristics of the power source is controlled by the difference between the digital input signal and the combined digital signal.

In accordance with an embodiment of the invention, the emulation of the output power generation characteristics of the power source is performed depending on operational parameters of the power source, the operational parameters being selected from the group of power source component temperature and power source component age.

In accordance with an embodiment of the invention, the reference power generator comprises a set of switches digitally controlled by the digital input signal, wherein each switch is controlling an amplifier, wherein the level of the analogue reference power is set by combining the electrical output of the switched amplifiers.

In accordance with a further embodiment of the invention, the power measurement component comprises an output magnetic field generating component, a reference magnetic field generating component and a magnetic field detection component, wherein the method further comprises inductively generating by the output magnetic field generating component an output magnetic field from the electrical output power and inductively generating by the reference magnetic field generating component a magnetic field from the analogue reference power, wherein the generated reference magnetic field is directed in opposite direction to the output magnetic field. The method further comprises determining by the magnetic field detection component the power differential between the electrical output power and the analogue reference power by measuring a superposition of the output magnetic field and the reference magnetic field.

In accordance with a further embodiment of the invention, the reference magnetic field creating component comprises multiple coil winding sets, wherein each coil winding set comprises at least one coil winding, wherein the method further comprises generating by the reference power generator the reference magnetic field level by selecting a number of the coil winding sets for feeding a reference current through the coil winding sets, wherein the number of selected coil winding sets is determined from the analogue reference power level.

In another aspect, the invention relates to a computer program product comprising computer executable instructions to perform any of the method steps according to the invention.

BRIEF DESCRIPTION OF THE DRAWINGS

In the following preferred embodiments of the invention are described in greater detail by way of example only making reference to the drawings in which.

DETAILED DESCRIPTION

Figure 1:
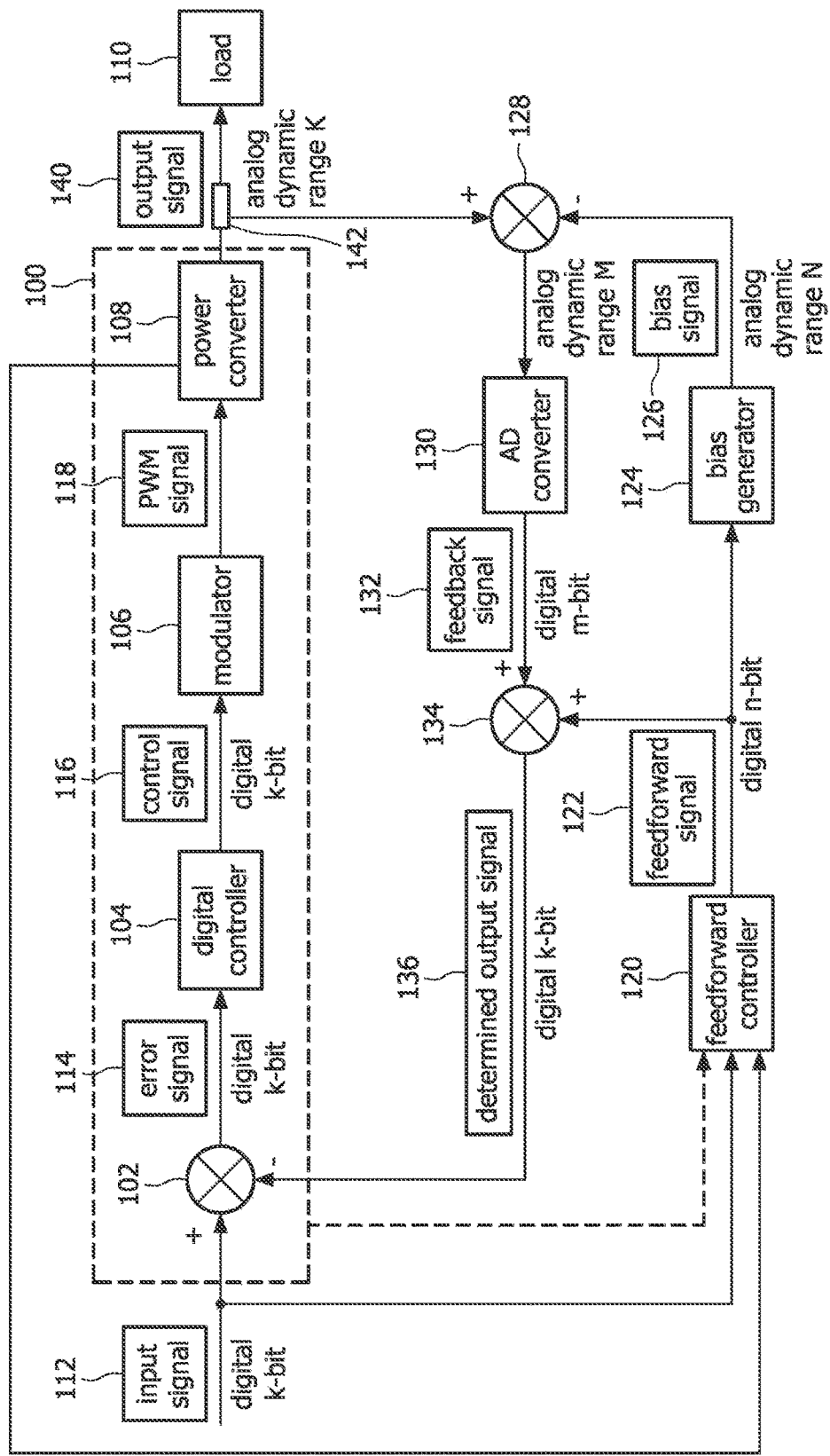
FIG. 1 is a block diagram illustrating an amplifier according to the invention.

In the following, similar elements are depicted by the same reference numerals.

FIG. 1 is a block diagram illustrating a digital amplifier according to the invention. The digital amplifier comprises a power source 100 with a digital input adapted for receiving a digital input signal 112. This input signal is a predetermined current curve shape that is available digitally at a resolution of k-bit. The output signal 140 of the power source 100 is a current flowing for example through a gradient coil, or in general a load 110. Ideally, the output signal 140 has the same curve shape as the input signal 112. The output current can have amplitudes up to 1,800 A, which however is not limited to this value, while the maximum deviation of the ideal curve shape is only allowed to be a few mA.

The power source 100 comprises a subtractor 102, a digital controller 104, a modulator 106 and a power converter 108. The output signal 140 is generated by the power converter 108 which converts a low power pulse width modulated (PWM) signal to a high power signal that drives the load 110. Most common is that the power converter 108 puts a high output voltage to the inductive load 110, resulting in a high current through the load, wherein this current through the load is called the output signal.

The modulator 106 is usually and preferably a digital device that converts the control signal 116 received from the digital controller 104 into a PWM signal 118. This PWM signal 118 is provided to the power converter 108.

The digital controller 104 reads the error signal 114 between the input signal 112 and a realized output signal 140 and provides appropriate control signals to the modulator 106 to counter the error signal. Preferably, the input signal 112, the error signal 114 and the control signal 116 are digital signals with a resolution of k-bits.

In order to determine the error signal between the input signal 112 and the realized output signal 140, the output signal 140 needs to be detected and analyzed. Detection is performed by means of the power measurement component 142. Analysis of the detected output signal with respect to the input signal 112 is performed by a feedforward and a feedback loop.

A feedforward controller 120 reads the input signal 112 and predicts the output signal as accurate as possible based on a model of the system. For example, the feedforward signal is corrected for time delay differences between the input signal, the feedback signal 132 in the feedback loop and the feedforward signal 122 supplied from the feedforward controller 120 to a bias generator 124 adapting for generating a reference current. In other words, the bias generator 124 converts the digital feedforward signal 122 into an analogue signal 126 to bias the output signal 140.

The feedforward controller 120 may further be adapted for receiving operational parameters of the power source 100. For example, the power converter 108 may comprise several temperature sensors which temperature values are provided preferably digitally to the feedforward controller 120, which in turn may correct its used model of the system. Further, the feedforward controller 120 may be adapted to receive error signals 114 from the power source 100 such that the feedforward controller 120 is able to self-correct for example for constant errors like offsets in the output signal 140. The origin of the error signals 114 is described in detail below.

The digital amplifier illustrated in FIG. 1 further comprises a subtractor 128 which subtracts the bias signal 126 from the output signal 140 detected by the power measurement component 142. This subtraction results in an analogue power differential current which is provided to the analogue-to-digital converter 130.

The analogue-to-digital converter 130 converts the difference between the output signal 140 and the bias signal 126 from the analogue to the digital domain. This analogue-to-digital converter (ADC) is required to convert only the difference between the output signal and the predicted output signal. Thus, the bias signal reduces the dynamic range of the output signal (k-bits) to a lower dynamic range for the feedback signal (m-bits).

The feedback signal 132 is combined by means of a combiner 134 with the feedforward signal 122. This results in a determined output signal 136 which is provided to the power source 100. For example, the power source 100 comprises a subtractor 102 which subtracts the determined output signal 136 from the input signal 112. This results in the error signal 114 which is fed to the digital controller 104 as already described above.

Thus, the feedforward signal 122 is a digital representation of the predicted output signal. The feedback signal 132 is a digital representation of the difference between the measured output signal and the predicted output signal. The combination of the feedforward 122 and feedback signal 132 is the digital representation of the measured output signal, called determined output signal 136. The difference between the determined output signal and the input signal is the error signal 114.

Even though, the bias signal 126 may not predict the output signal 140 at maximum accuracy, the dynamic range of the difference between the output signal 140 and the bias signal 126 is typically less than 1% of the output signal 140. As a consequence, the dynamic range of this difference in output signal and bias signal is rather low, such that a simple AD converter 130 is only required in order to accurately digitize the difference between the output signal and the bias signal for receiving the feedback signal 132 with a resolution of a few mA.

In order to illustrate this in more detail, the input signal 112 is a digital signal with a resolution of k-bit. The feedforward signal 122 is a digital signal with a resolution of n-bit, wherein n<k. The feedback signal 132 is a digital signal with a resolution of m-bit, wherein m<k and n+m=k. The m least significant bits of the determined output signal are a representation of the feedback signal, wherein the n most significant bits of the determined output signal is a representation of the feedforward signal.

It is for example expected that the feedforward controller 120 can produce a feedforward signal of 6 bits (n=6). This allows using a simple feedforward controller to predict the output signal with moderate accuracy meeting the requirement of 1% mentioned above. It is further assumed that the input signal has a resolution of 18 bits (k=18). The required resolution of the AD converter 130 is m-bit (m=k−1=12 bits). This AD conversion can be realized by a 12 bit AD converter but can also be realized by an ADC with less bits in combination with resolution enhancement techniques like over-sampling.

Figure 2:
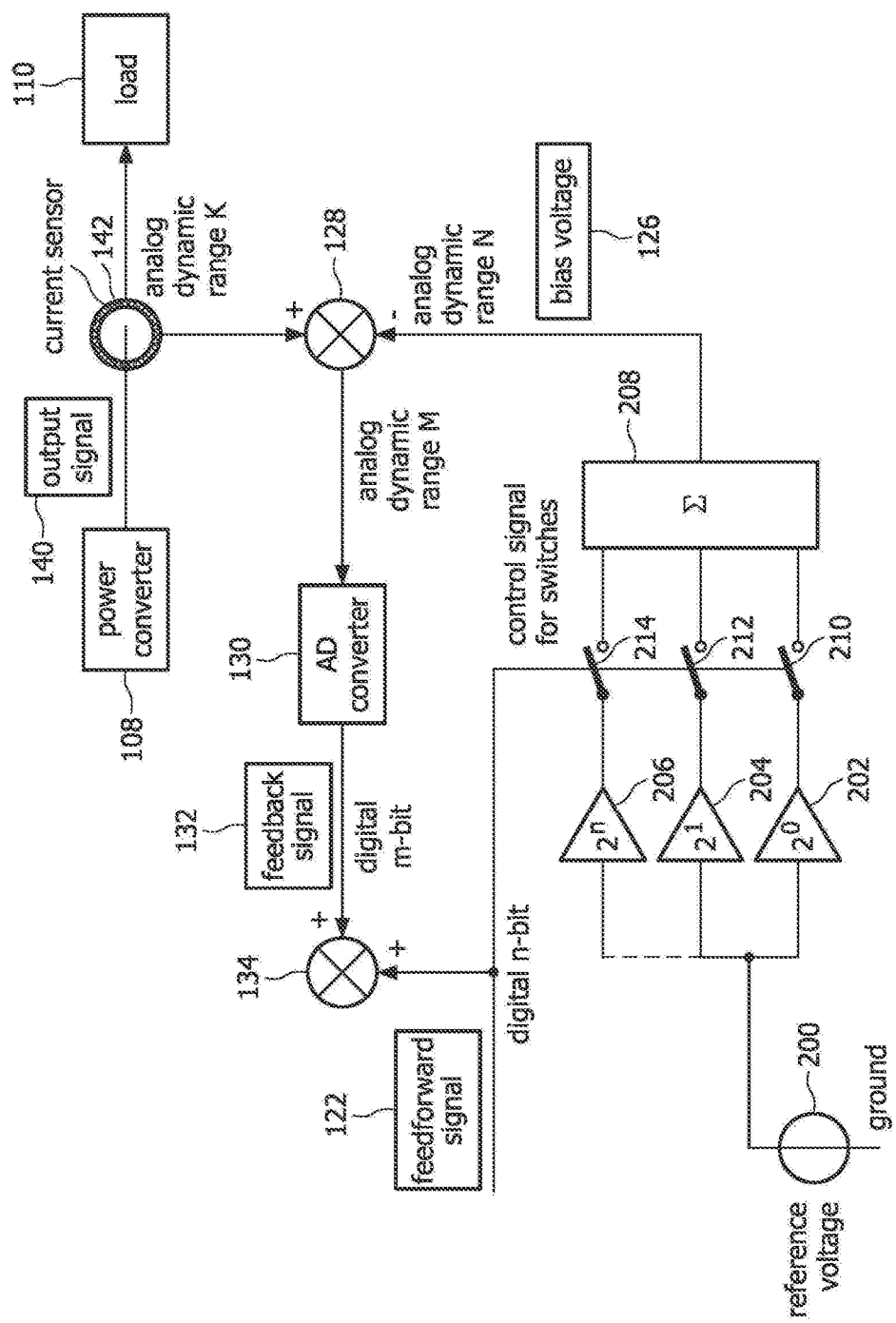
FIG. 2 is a further block diagram illustrating an amplifier comprising switched amplifiers as reference power source.

FIG. 2 illustrates a part of the digital amplifier of FIG. 1, with the reference power generator (or bias generator) 124 being represented by a set of switches 210, 212 and 214, a set of amplifiers 202-206 and an analogue summator 208. In the embodiment depicted in FIG. 2, the feedforward signal 122 which is a digital signal of n-bits controls n switches 210, 212 and 214 that set the bias voltage. A precise reference voltage from a source 200 is amplified by n-amplifiers 202, 204 and 206 by a factor $2^0, 2^1, \ldots, 2^n$. Depending on the state of the switches 210, 212 and 214, these amplified signals can be connected to an analogue summator, like for example a precision operational amplifier 208. The output of the summator 208 is the bias voltage or bias signal 126 which is subtracted from the current sensor 142 output voltage. This results in the analogue feedback signal which represents the difference between the output current and the bias signal. The analogue feedback signal is then digitized by the AD converter 130 resulting in the feedback signal 132.

In FIG. 2, the output signal is measured by an accurate current sensor 142. Normally such a sensor generates a current that is a scaled representation of the output current through the gradient coil, or in general the load 110. Also, the sensor output is preferably galvanically isolated from the power converter 108 and the load 110. The sensor output current is converted to a voltage by means of for example a burden resistor.

However, it has to be noted here that the current sensor may be any kind of state of the art current sensors, including Hall sensors, SQUID sensors, sensors working with inductively coupled coils etc.

In the embodiment depicted in FIG. 2, only one accurate reference source 200 is required, wherein further the components like the operational amplifiers 202-206 and the summator 208 can be implemented by simple and commercially available components. Nevertheless, it should be noted, that the amplifiers 202-206 used to amplify the individual bias voltages should also be rather accurate. In order to further improve this accuracy, it is preferred to compensate for static gain errors of these amplifiers by for example calibration.

Figure 3:
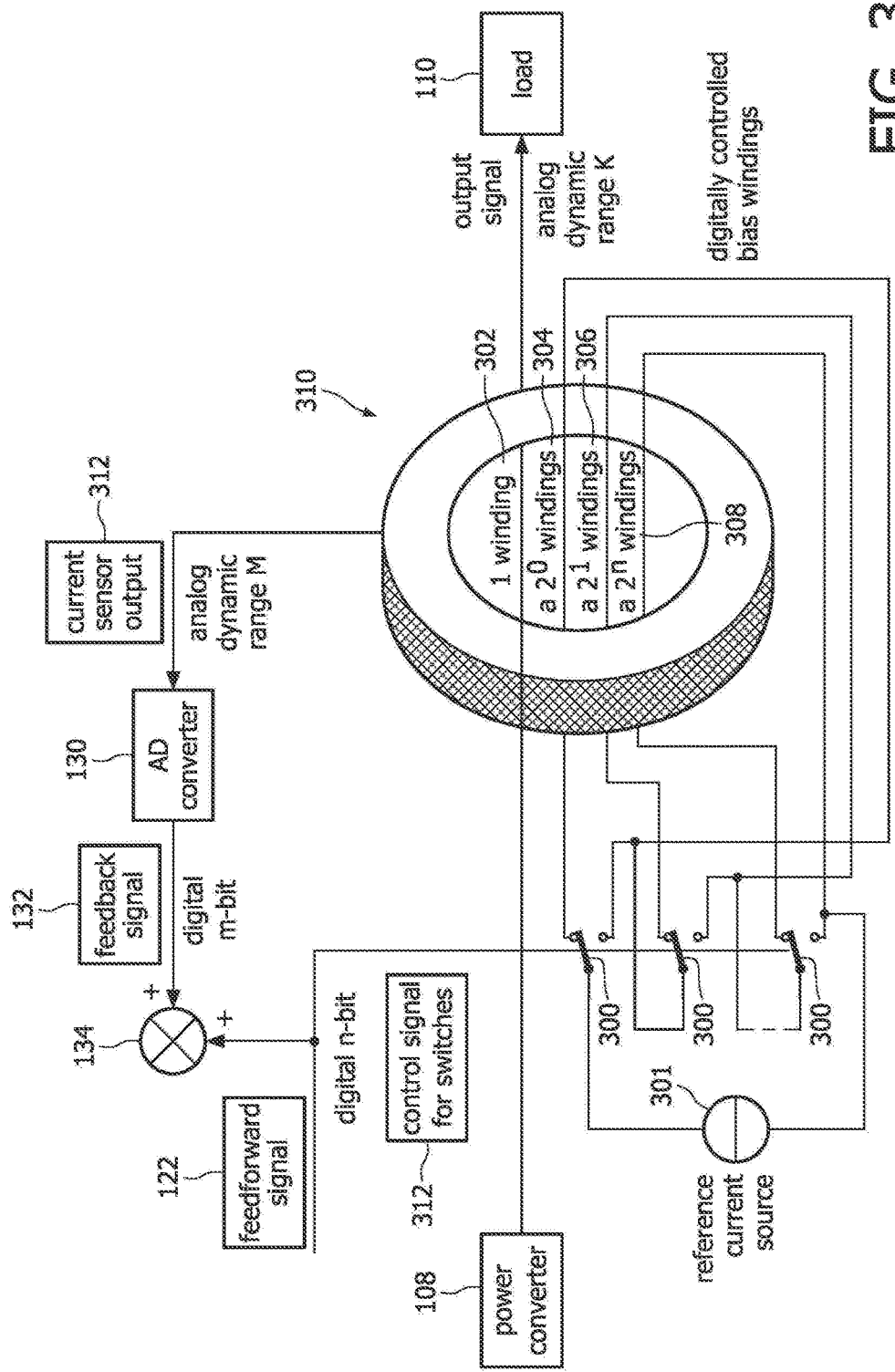
FIG. 3 is a block diagram illustrating a current sensor for an amplifier according to the invention.

FIG. 3 illustrates a further embodiment of a digital amplifier according to the invention. In contrast to the power measurement component consisting in FIG. 2 of the sensor 142 and the subtractor 128, the power measurement component in FIG. 3 is given by a combination of a pickup coil 310 and several conductors 302-308. In the embodiment of FIG. 3, a separate subtractor 128 is not required anymore.

Assuming, that the conductors 302-308 are coil windings located for example within a pickup coil 310, the output of the power converter 108 may be connected by one coil winding 302 to the load 110. The bias currents flowing through the windings 304-308 are generated by a single reference current source 301. Depending on the state of the switches 300, set by the feedforward signal 122 by means of a control signal 312, the reference current (bias current) flows through a number of windings 304-308 in the current sensor 310. The windings 304-308 through the current sensor representing the bias signal of the individual bits of the feedforward signal have a number of turns related to the bit position of the feedforward signal 122. Because the output current is up to 1,000 A (not limited to, see earlier) and normally measured by a single turn in the current sensor 310, either the bias current should be large or the number of bias turns 304-308 should be relatively high. In FIG. 3, the number of turns is shown as $a \cdot 2^n$. Hereby, a is an integer number.

Important in FIG. 3 is, that by means of the coil windings 304-308 of the pickup coil 310 and the coil winding 302 through which the output current from the power converter 108 to the load 110 is flowing, resulting magnetic fields are generated which point in opposite directions. This can be achieved in two ways: 1) having the current flow in opposite directions, 2) having the windings through the core in opposite directions. FIG. 3 shows opposite direction of windings through the core, so the current should be have same sign. This results in the generation of two opposite magnetic fields.

As a consequence, the current sensor output 312 detected by the sensor 310 'automatically' only comprises the difference between the output signal and the predicted reference output signal. Thus, the dynamic range of the current sensor output 312 is already reduced such that the AD converter 130 is only required to convert the analogue current sensor output signal 312 to the digital feedback signal 132 with a resolution of m-bit, wherein the input signal is a digital signal with a resolution of k-bit, the feedforward signal is a digital signal with a resolution of m-bit with $n<k$ and with $m<k$ and $n+m=k$.

Figure 4:
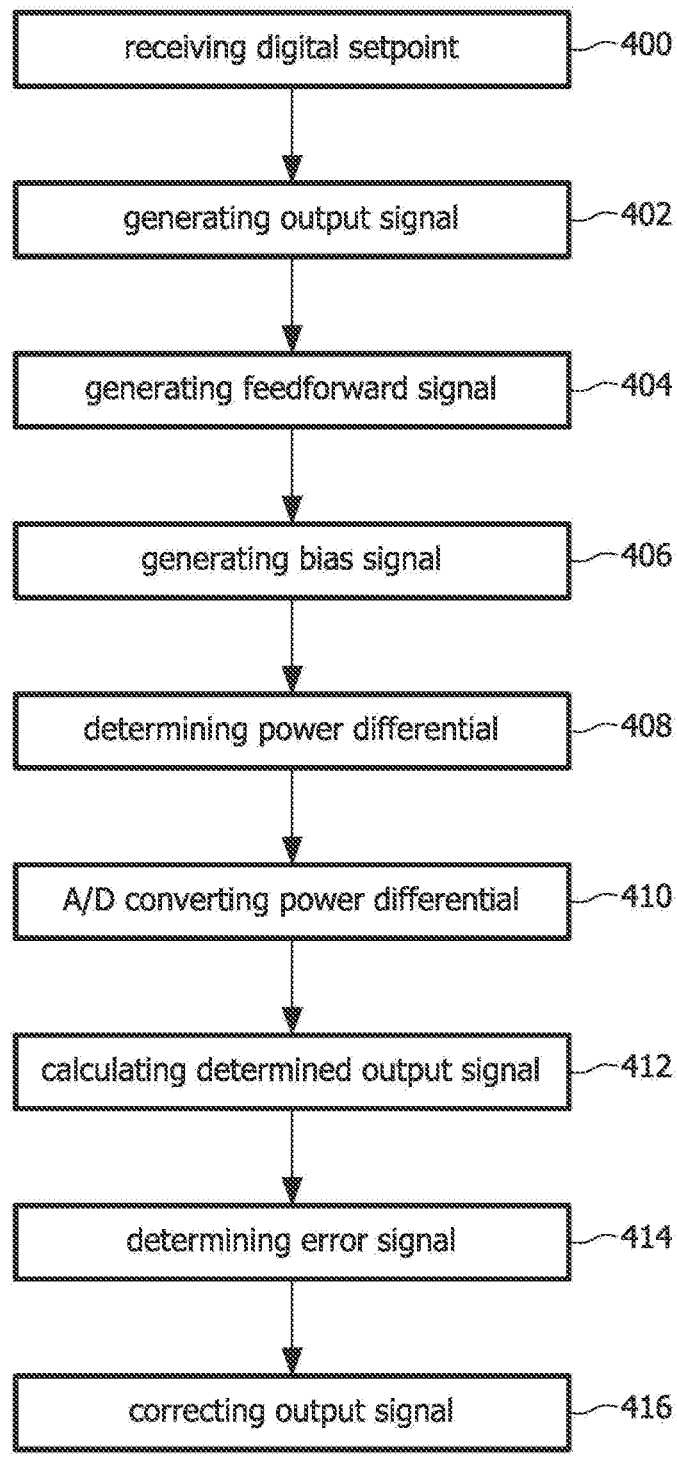
FIG. 4 is a flowchart illustrating the method of operating an amplifier according to the invention.

FIG. 4 is a flowchart illustrating the method according to the invention of providing a desired electrical output power by a digital amplifier. In step 400, a digital set point of resolution k-bits is received. A power source is generating in step 402 the output signal specified by the digital set point. Further, in step 404 a feedforward signal is generated by a feedforward controller, wherein the generated feedforward signal has a resolution of n-bits, wherein $n<k$. From the feedforward signal, in step 406 an analogue bias signal is generated, wherein in step 408 an analogue power differential between the analogue bias signal and the generated analogue output signal is determined.

In step 410, this analogue power differential is converted into a digital feedback signal, wherein the feedback signal is a digital signal with a resolution of m-bit. In step 412, a determined output signal is calculated by combining the feedforward signal and the feedback signal. From the determined output signal, in step 414 an error signal is determined describing the difference between the desired electrical output level specified by the digital input signal and the measured analogue output signal. This is followed by step 416 in which the actual output signal is corrected by the error signal for providing a corrected output signal in step 416.

REFERENCE NUMERALS:

100 Power source
102 subtractor
104 digital controller
106 modulator
108 power converter
110 load
112 input signal
114 error signal
116 control signal
118 PWM signal
120 feedforward controller
122 feedforward signal
124 bias generator
126 bias signal
128 subtractor
130 AD converter
132 feedback signal
134 combiner
136 determined output signal
140 output signal
142 sensor
200 voltage source
202 amplifier
204 amplifier
206 amplifier
208 summator
210 switch
212 switch
214 switch
300 switch
301 reference current source
302 winding
304 winding
306 winding
308 winding
310 pickup coil
312 control signal

The invention claimed is:

1. A digital amplifier for providing a desired electrical output power, the amplifier comprising:
   a power source for generating the electrical output power;
   a digital input adapted for receiving a digital input signal, the digital input signal representing the desired electrical output power level;
   a reference power generator for generating an analogue reference power controlled by the digital input signal, the reference power generator comprising a set of switches digitally controlled by the digital input signal;
   a power measurement component adapted for measuring the power differential between the electrical output power provided by the power source and the analogue reference power;
   an analogue-to-digital converter adapted for converting the power differential into a digital power differential value;
   a combiner adapted for providing a combined digital signal by adding the digital power differential value to a signal including at least the digital value input signal to the reference power generator for generating the analogue reference power;

wherein the power source is adapted for providing the electrical output power corrected for the difference between a power value indicated by the digital input signal and the combined digital signal.

2. The digital amplifier of claim 1, wherein each switch is configured to control the electrical output of at least one amplifier.

3. The digital amplifier of claim 2, wherein the reference power generator is adapted for setting the level of the analogue reference power by combining the electrical output of the at least one amplifier.

4. The digital amplifier of claim 2, wherein the at least one amplifier includes three amplifiers, each amplifier being controlled by a corresponding switch of the set of switches.

5. The digital amplifier of claim 4, wherein the switches are configured to be controlled by the input signal to set a bias voltage value.

6. The digital amplifier of claim 5, wherein the amplifiers are configured to amplify a corresponding reference voltage signal from a voltage source.

7. The digital amplifier of claim 6, further comprising an analogue summator configured to combine the corresponding amplified reference voltage signals.

8. The digital amplifier of claim 7, wherein the analogue summator is configured to combine the corresponding amplified reference voltage signals when the corresponding switches of the corresponding amplifiers are in an open state.

9. The digital amplifier of claim 8, wherein the analogue summator is configured to combine the amplified reference voltage signals only when the corresponding switch of each of the corresponding amplifier is in an open state.

10. The digital amplifier of claim 9, wherein the analogue summator is configured to:
output a bias voltage signal from the combined the amplified reference voltage signals; and
subtract the bias voltage signal from an output voltage signal measured by the power measurement component.

11. A method of providing a desired electrical output power by a digital amplifier, the amplifier comprising a power source for generating the electrical output power, the method comprising:
receiving a digital input signal by the amplifier, the digital input signal representing the desired electrical output power level;
generating by a reference power generator an analogue reference power, wherein the reference power generation is controlled by the digital input signal;
digitally controlling a set of switches on the reference power generator by the digital input signal;
measuring the power differential between the electrical output power provided by the power source and the analogue reference power by a power measurement component;
converting the power differential into a digital power differential value by an analogue-to-digital converter;
by a combiner, providing a combined digital signal by adding the digital power differential value to a signal including at least the digital value input signal to the reference power generator for generating the analogue reference power;
wherein the power source is providing the electrical power corrected for the difference between a power value indicated by the digital input signal and the combined digital signal.

12. The method of claim 11, further including:
controlling the electrical output of at least one amplifier with each switch.

13. The method of claim 12, further including:
with the reference power generator, setting the level of the analogue reference power by combining the electrical output of the at least one amplifier.

14. The method of claim 12, wherein the at least one amplifier includes three amplifiers, and the method further includes:
controlling each amplifier with a corresponding switch of the set of switches.

15. The method of claim 14, further including controlling the switches with the input signal to set a bias voltage value.

16. The method of claim 15, further including:
with the amplifiers, amplifying a corresponding reference voltage signal from a voltage source.

17. The method of claim 16, further including:
with an analogue summator, combining the corresponding amplified reference voltage signals.

18. The method of claim 17, further including:
with the analogue summator, combining the corresponding amplified reference voltage signals when the corresponding switch of the corresponding amplifiers is in an open state.

19. The method of claim 18, further including:
with the analogue summator, combining the amplified reference voltage signals only when the corresponding switch of each of the corresponding amplifier is in an open state.

20. The method of claim 19, further including, with the analogue summator:
outputting a bias voltage signal from the combined the amplified reference voltage signals; and
subtracting the bias voltage signal from an output voltage signal measured by the power measurement component.

* * * * *